United States Patent
Tokinoya (10) Patent No.: US 10,696,017 B2
(45) Date of Patent: Jun. 30, 2020

(54) TRANSPARENT GAS BARRIER LAMINATE FILM AND ELECTRONIC PAPER USING THE SAME

(71) Applicant: TOPPAN PRINTING CO., LTD., Tokyo (JP)

(72) Inventor: Osamu Tokinoya, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 206 days.

(21) Appl. No.: 15/728,023

(22) Filed: Oct. 9, 2017

(65) Prior Publication Data

US 2018/0036999 A1 Feb. 8, 2018

Related U.S. Application Data

(63) Continuation of application No. PCT/JP2016/061937, filed on Apr. 13, 2016.

(30) Foreign Application Priority Data

Apr. 15, 2015 (JP) .................................. 2015-083112

(51) Int. Cl.
*B32B 9/00* (2006.01)
*B32B 27/30* (2006.01)
(Continued)

(52) U.S. Cl.
CPC .................. *B32B 9/00* (2013.01); *B32B 7/12* (2013.01); *B32B 27/06* (2013.01); *B32B 27/08* (2013.01);
(Continued)

(58) Field of Classification Search
CPC .......... B32B 2255/20; B32B 2255/205; B32B 2307/412; B32B 2307/7244;
(Continued)

(56) References Cited

U.S. PATENT DOCUMENTS 4,565,743 A * 1/1986 Akao ....................... C08J 7/047
206/524.2
2003/0157354 A1 * 8/2003 Van Veghel ........ C08L 2666/06
428/515
(Continued)

FOREIGN PATENT DOCUMENTS

JP 2000233478 A * 8/2000
JP 2003-152206 5/2003
(Continued)

OTHER PUBLICATIONS

Sugita et al, JP 2000-233478A English translation (Year: 2000).*
International Search Report issued in International Patent Application No. PCT/JP2016/061937 dated Jul. 19, 2016.

*Primary Examiner* — Scott R. Walshon
*Assistant Examiner* — Jasper Saberi
(74) *Attorney, Agent, or Firm* — Foley & Lardner LLP (57) ABSTRACT

A transparent gas barrier laminate film in which a gas barrier layer including an inorganic thin film layer is formed on at least one surface of a first transparent plastic film substrate, and the surface of the first transparent plastic film substrate on which the gas barrier layer is formed and one surface of a second transparent plastic film substrate are bonded to each other with a first adhesive layer interposed therebetween, and a seal layer is formed on the other surface of the first transparent plastic film substrate or the second transparent plastic film substrate.

14 Claims, 4 Drawing Sheets

(51) Int. Cl.
    *B32B 27/36*     (2006.01)
    *B32B 27/34*     (2006.01)
    *B32B 27/32*     (2006.01)
    *B32B 7/12*     (2006.01)
    *C08J 7/04*     (2020.01)
    *H01L 51/52*     (2006.01)
    *G02F 1/1333*     (2006.01)
    *B32B 27/06*     (2006.01)
    *B32B 27/08*     (2006.01)
    *C23C 14/10*     (2006.01)

(52) U.S. Cl.
    CPC ............ *B32B 27/30* (2013.01); *B32B 27/306* (2013.01); *B32B 27/32* (2013.01); *B32B 27/34* (2013.01); *B32B 27/36* (2013.01); *B32B 27/365* (2013.01); *C08J 7/0423* (2020.01); *C23C 14/10* (2013.01); *G02F 1/1333* (2013.01); *H01L 51/524* (2013.01); *B32B 2250/03* (2013.01); *B32B 2250/04* (2013.01); *B32B 2250/24* (2013.01); *B32B 2250/246* (2013.01); *B32B 2255/10* (2013.01); *B32B 2255/20* (2013.01); *B32B 2255/205* (2013.01); *B32B 2255/26* (2013.01); *B32B 2255/28* (2013.01); *B32B 2307/206* (2013.01); *B32B 2307/306* (2013.01); *B32B 2307/412* (2013.01); *B32B 2307/422* (2013.01); *B32B 2307/546* (2013.01); *B32B 2307/71* (2013.01); *B32B 2307/7244* (2013.01); *B32B 2307/732* (2013.01); *B32B 2307/736* (2013.01); *B32B 2457/00* (2013.01); *B32B 2553/00* (2013.01); *G02F 2201/501* (2013.01)

(58) Field of Classification Search
    CPC .......... B32B 2457/20; B32B 2457/202; B32B 2457/204; B32B 2457/206; B32B 2457/208; B32B 2307/31; B32B 7/12; B32B 2307/71; B32B 9/00; B32B 27/06; B32B 27/08; B32B 27/36; B32B 27/32–327; H01L 51/524; H01L 51/5243; H01L 51/5253
    See application file for complete search history.

(56) References Cited

U.S. PATENT DOCUMENTS

| | | | |
|---|---|---|---|
| 2006/0062995 A1* | 3/2006 | Yamamoto | B32B 27/08 428/332 |
| 2007/0160786 A1* | 7/2007 | Levin | C23C 28/00 428/35.2 |
| 2010/0272936 A1* | 10/2010 | White | B32B 27/08 428/35.4 |
| 2011/0052893 A1* | 3/2011 | Oouchi | B32B 7/12 428/216 |
| 2011/0086220 A1* | 4/2011 | Yoshida | B32B 27/281 428/317.5 |
| 2012/0021236 A1* | 1/2012 | Neumann | B32B 27/34 428/500 |
| 2016/0176166 A1* | 6/2016 | Matsui | B32B 27/32 428/461 |

FOREIGN PATENT DOCUMENTS

| | | |
|---|---|---|
| JP | 2004-051174 | 2/2004 |
| JP | 2005-019286 | 1/2005 |
| JP | 2006-076603 | 3/2006 |
| JP | 2006-327098 | 12/2006 |
| JP | 2011-230455 | 11/2011 |
| JP | 2013-145807 | 7/2013 |
| JP | 2014-024321 | 2/2014 |
| WO | WO-2009/150992 | 12/2009 |

\* cited by examiner

FIG.4

TRANSPARENT GAS BARRIER LAMINATE FILM AND ELECTRONIC PAPER USING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/061937, filed on Apr. 13, 2016, which is based upon and claims the benefit of priority of Japanese Patent Application No. 2015-083112, filed on Apr. 15, 2015, the entireties of which are hereby incorporated by reference.

TECHNICAL FIELD

The present invention relates to a transparent gas barrier laminate film and electronic paper using the same.

BACKGROUND

In liquid crystal display panels, organic EL display panels, electrochromic panels, electronic paper (electronic paper elements) and the like, elements using a glass substrate have been used. In recent years, demand has been shifting from elements using a glass substrate to elements using a transparent plastic film substrate considering lightness, bendability, impact resistance and applicability to larger sizes. However, there is a problem that transparent plastic film substrates are inferior to glass substrates in gas barrier properties to water vapor or oxygen, which may affect the display performance of an element using a transparent plastic film substrate.

In order to overcome such disadvantages of transparent plastic film substrates, it has been proposed to form a transparent gas barrier layer on a transparent plastic film substrate. For such a transparent gas barrier layer, an oxide thin film of Si or Al ($SiO_2$ thin film or $Al_2O_3$ thin film) is used to maintain transparency. Further, in producing a transparent gas barrier layer, vacuum deposition processes such as vacuum vapor deposition, sputtering, ion plating and the like are used. However, use of solely a transparent film on which a transparent gas barrier layer is formed causes a problem that cracks or pinholes caused by bending often occur in the transparent gas barrier layer formed of an oxide thin film and gas barrier properties cannot be maintained.

Some proposals have been made for these problems. For example, it is proposed to form a transparent gas barrier layer on a transparent plastic film substrate by a vacuum vapor deposition and then form an organic coating film on the transparent gas barrier layer to form a multi-layered film of the organic coating film, or to devise the composition of the organic coating film (see for example PTL 1).

In electronic paper elements, it is proposed to use a transparent gas barrier laminate film formed by providing a transparent gas barrier layer on a transparent plastic film substrate and then laminating the transparent plastic film substrate on another transparent plastic substrate via a pressure-sensitive adhesive or adhesive (see for example PTL 2).

CITATION LIST

Patent Literature

PTL 1: JP-2005-19286 A
PTL 2: JP-2006-327098 A

SUMMARY OF THE INVENTION

Technical Problem

However, in producing an electronic paper element by using the transparent gas barrier laminate film described in PTL 2, an attachment layer for attachment to the printed substrate and the like needs to be separately provided. Since the gas barrier properties are not confirmed, there is a risk that defects may occur in a display of the electronic paper.

Further, when the transparent gas barrier laminate film is attached to a printed substrate and the like, there is another problem that, if the printed substrate itself has an irregular surface due to having wirings thereon, the film conforms to an irregular surface of the printed substrate, which creates wrinkles.

The present invention has been made in light of the above circumstances and has an object to provide a transparent gas barrier laminate film with good gas barrier properties which is provided with an attachment layer for attachment to a printed substrate and the like, and is capable of forming an element without creating wrinkles even if a printed substrate has an irregular surface, and to provide an electronic paper element using the same.

Solution to Problem

In order to solve the above problems, the present invention adopts the following configuration.

[1] A transparent gas barrier laminate film in which a gas barrier layer including an inorganic thin film layer is formed on at least one surface of a first transparent plastic film substrate, and the surface of the first transparent plastic film substrate on which the gas barrier layer is formed and one surface of a second transparent plastic film substrate are bonded to each other with a first adhesive layer interposed therebetween, and a seal layer is formed on the other surface of the first transparent plastic film substrate or the second transparent plastic film substrate.

[2] The transparent gas barrier laminate film according to [1], wherein the second transparent plastic film substrate is a polypropylene film.

[3] The transparent gas barrier laminate film according to [1] or [2], wherein the gas barrier layer includes the inorganic thin film layer and a gas barrier cover layer formed on the inorganic thin film layer.

[4] The transparent gas barrier laminate film according to any one of [1] to [3], wherein a coefficient of thermal shrinkage of the second transparent plastic film substrate at 150° C. for 30 minutes is in a range of 5% or more and 15% or less.

[5] The transparent gas barrier laminate film according to any one of [1] to [4], wherein a third transparent plastic film substrate is disposed via a second adhesive layer on a surface opposite to a surface on which the seal layer is formed.

[6] The transparent gas barrier laminate film according to [5], wherein the third transparent plastic film substrate is a polyester film.

[7] The transparent gas barrier laminate film according to any one of [1] to [6], wherein the first adhesive layer includes at least one selected from ultraviolet absorbers and fluorescent brightening agents.

[8] The transparent gas barrier laminate film according to [5] or [6], wherein the second adhesive layer includes at least one selected from ultraviolet absorbers and fluorescent brightening agents.

[9] The transparent gas barrier laminate film according to any one of [1] to [6], wherein a coat layer including at least one selected from ultraviolet absorbers and fluorescent brightening agents is provided between the second transparent plastic film substrate and the first adhesive layer.

[10] The transparent gas barrier laminate film according to any one of [1] to [6], wherein at least one selected from ultraviolet absorbers and fluorescent brightening agents is impregnated in the second transparent plastic film substrate.

[11] The transparent gas barrier laminate film according to claim [5] or [6], wherein at least one selected from ultraviolet absorbers and fluorescent brightening agents is impregnated in the third transparent plastic film substrate.

[12] The transparent gas barrier laminate film according to any one of [1] to [11], wherein the seal layer contains ethylene-vinyl acetate copolymer resin.

[13] The transparent gas barrier laminate film according to claim 12, wherein a vinyl acetate content in the ethylene-vinyl acetate copolymer resin is in a range of 10 to 30 mol %.

[14] The transparent gas barrier laminate film according to any one of [1] to [13], wherein the gas barrier layer has a structure in which two or more inorganic thin film layers and two or more gas barrier cover layers are alternately laminated.

[15] Electronic paper which is sealed by the transparent gas barrier laminate film according to any one of [1] to [14] via the seal layer.

Advantageous Effects of Invention

The transparent gas barrier laminate film of the present embodiment is a transparent gas barrier laminate film in which the first transparent plastic film substrate having the gas barrier layer formed thereon is disposed on the second transparent plastic film substrate via the adhesive, and the seal layer is further disposed on the first transparent plastic film substrate. Accordingly, a transparent gas barrier laminate film with better or even high gas barrier properties that can be bonded to the printed substrate having an irregular surface while better preventing occurrence of wrinkles, and can be heat-sealed taking the seal layer as an attachment layer, can be obtained.

Further, electronic paper of the present invention is sealed by the transparent gas barrier laminate film of the present invention via the seal layer as described above, and has a function of better reducing ultraviolet transmission. Accordingly, the display performance of the electronic paper can be more favorably maintained for a long period of time.

DESCRIPTION OF REPRESENTATIVE EMBODIMENTS

With reference to the drawings, preferred embodiments of the present invention will be described in detail. It is to be understood that the present invention is not necessarily limited to the embodiments set forth below. The described embodiments are intended to be representative of the present invention. In the drawings, the same or corresponding parts are denoted by the same reference characters, and duplicated description thereof is omitted. The positional relationship such as up-down, left-right is based on the positional relationship shown in the figure, unless otherwise specifically described. Further, the dimensions in the drawings are not to scale.

<Transparent Gas Barrier Laminate Film According to First Embodiment>

Figure 1:
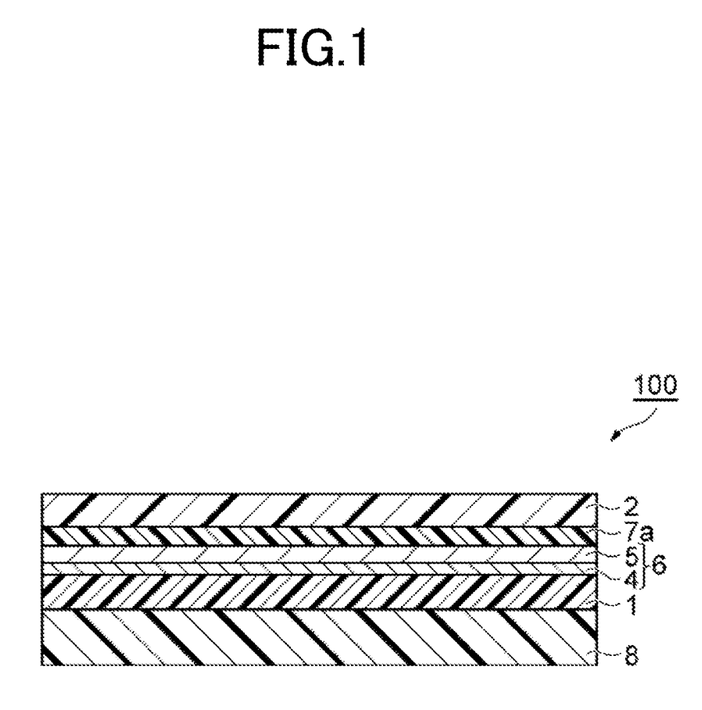
FIG. 1 is a schematic cross-sectional view of a transparent gas barrier laminate film according to a first embodiment of the present invention.

A first embodiment of the present invention will be described. FIG. 1 is a schematic cross-sectional view of a transparent gas barrier laminate film according to a first embodiment of the present invention.

As shown in FIG. 1, a transparent gas barrier laminate film 100 of the present embodiment has a structure in which a first transparent plastic film substrate 1 having a gas barrier layer 6 formed thereon and a seal layer 8 are disposed in this order on a second transparent plastic film substrate 2 via a first adhesive layer 7a. The transparent gas barrier laminate film 100 of the present embodiment is a laminate film in which the first transparent plastic film substrate having the gas barrier layer formed thereon and the seal layer are disposed in this sequence on the second transparent plastic film substrate 2 via the first adhesive layer 7a. Accordingly, a transparent gas barrier laminate film with high gas barrier properties that can be bonded to the printed substrate having an irregular surface while preventing occurrence of wrinkles, and can be heat-sealed taking the seal layer as an attachment layer can be obtained.

Hereinafter, layers that constitute the transparent gas barrier laminate film 100 will be described in detail, which can also be applied to the second, third and fourth embodiments.

The first transparent plastic film substrate 1 is preferably a substrate having a total light transmittance of 85% or more, but is not limited thereto as long as it is a plastic film that can be used as an ordinary optical material. Examples of such a plastic film include polyolefin of a single polymer or copolymer such as ethylene, propylene and butane, polyester such as polyethylene terephthalate and polyethylene naphthalate, polyamide such as Nylon 6, Nylon 66, Nylon 12 and copolymer Nylon, and polycarbonate. In particular, polyethylene terephthalate, polyethylene naphthalate or the like can be advantageously used as a substrate having high transparency and heat resistance.

Further, a thickness of the first transparent plastic film substrate 1 is not specifically limited, but is preferably not more than 50 μm in order to reduce the total thickness of the transparent gas barrier laminate film 100. Further, the thickness of the first transparent plastic film substrate 1 is preferably not less than 12 μm in order to provide the gas barrier layer 6 and obtain good gas barrier properties.

The gas barrier layer 6 preferably includes an inorganic thin film layer 4 and a gas barrier cover layer 5. As shown in FIG. 1, the gas barrier layer 6 is configured such that the inorganic thin film layer 4 is formed on one surface of the first transparent plastic film substrate 1 and the gas barrier cover layer 5 is laminated on the inorganic thin film layer 4.

The inorganic thin film layer 4 may be formed of, but is not specifically limited to, an inorganic oxide thin film of aluminum oxide, silicon oxide, magnesium oxide or the like or a mixture thereof. Among these, aluminum oxide or silicon oxide is preferably used in view of barrier properties and productivity.

The thickness (film thickness) of the inorganic thin film layer 4 is preferably in the range of 5 to 500 nm, and more preferably in the range of 10 to 100 nm. When the film thickness is 5 nm or more, it facilitates forming of a uniform film and tends to perform a function as a gas barrier material more sufficiently. On the other hand, when the film thickness is 500 nm or less, it allows the thin film (gas barrier layer) to maintain a sufficient flexibility, and more reliably prevents occurrence of cracks in the thin film (gas barrier layer) after film formation due to external factors such as bending or tension.

As the inorganic thin film layer 4, a vapor deposition layer made of inorganic oxide may be formed on the first transparent plastic film substrate 1 by using an ordinary vacuum vapor deposition process. Alternatively, other thin film forming processes such as sputtering, ion plating and plasma enhanced chemical vapor deposition (CVD) may be used. Considering the productivity, a vacuum vapor deposition technique may be favorably used. A heating means for vacuum vapor deposition may use any of electron beam heating, resistance heating and induction heating. Further, in order to enhance adhesiveness between the vapor deposition layer and the substrate and improve the density of the vapor deposition layer, vapor deposition may be performed by using a plasma assisted method or an ion beam assisted method. Further, in order to improve transparency of the vapor deposition layer, reactive evaporation may be performed by injecting oxygen gas or the like during vapor deposition.

The gas barrier cover layer 5 is provided to prevent occurrence of a variety of secondary damage in a post-process and impart high barrier properties. The gas barrier cover layer 5 preferably contains a component, at least one selected from the group consisting of hydroxyl group-containing polymer compound, metal alkoxide, metal alkoxide hydrolysate and metal alkoxide polymer in view of obtaining good barrier properties.

The hydroxyl group-containing polymer compound specifically include, for example, a water-soluble polymer such as polyvinyl alcohol, polyvinylpyrrolidone or starch. In particular, the highest barrier properties can be obtained by using polyvinyl alcohol.

The metal alkoxide is a compound expressed by a general formula: $M(OR)_n$ (M represents a metal atom such as Si, Ti, Al or Zr, R represents an alkyl group such as $—CH_3$ or $—C_2H_5$, and n represents an integer corresponding to a valence of M). Specifically, tetraethoxysilane $[Si(OC_2H_5)_4]$, triisopropoxy aluminum $[Al(O\text{-iso-}C_3H_7)_3]$ or the like may be used. Tetraethoxysilane and triisopropoxy aluminum are preferred since they are relatively stable in an aqueous solvent after hydrolysis. Further, the metal alkoxide hydrolysate and metal alkoxide polymer include, for example, silicic acid $Si(OH)_4$ as a tetraethoxysilane hydrolysate or a tetraethoxysilane polymer, and aluminum hydroxide $Al(OH)_3$ as a triisopropoxy aluminum hydrolysate or a triisopropoxy aluminum polymer.

The thickness (film thickness) of the gas barrier cover layer 5 is preferably in the range of 50 to 1000 nm, and more preferably in the range of 100 to 500 nm. When the film thickness is 50 nm or more, sufficient gas barrier properties are likely to be obtained. When the film thickness is 1000 nm or less, sufficient flexibility is likely to be maintained by a thin film (gas barrier layer).

A coating agent containing a material which serves as a gas barrier coating layer may be applied by a method known in the art such as dipping, roll coating, screen printing, spray coating, gravure printing or the like.

The second transparent plastic film substrate 2 may be formed of the same plastic film as the first transparent plastic film substrate 1. The second transparent plastic film substrate 2 is laminated on the surface of the first transparent plastic film substrate 1 having the gas barrier layer 6 formed thereon opposite to the surface on which the seal layer 8 is laminated to thereby protect the gas barrier layer 6 and reduce occurrence of wrinkles due to an irregular surface of the printed substrate when the film is bonded to the printed substrate.

A coefficient of shrinkage of the second transparent plastic film substrate 2 when heated at 150° C. for 30 minutes (that is, a coefficient of thermal shrinkage of the second transparent plastic film substrate 2 at 150° C. for 30 minutes) is preferably in the range of 5% or more and 15% or less. When the coefficient of thermal shrinkage of the second transparent plastic film substrate is 5% or more, the transparent gas barrier laminate film can be more readily deformed along the irregular surface of the printed substrate and bonded thereto without creating wrinkles when laminated on the electronic paper substrate and sealed thereto. When the coefficient of thermal shrinkage of the second transparent plastic film substrate is 15% or less, barrier properties can be more readily maintained without damaging the gas barrier layer 6 by thermal deformation of the transparent gas barrier laminate film. The coefficient of thermal shrinkage of the second transparent plastic film substrate 2 can be measured according to a measurement method specified in JIS K 7133. In the case where the second transparent plastic film substrate has different coefficients of thermal shrinkage in a TD direction (transverse direction) and an MD direction (machine direction), at least either of the coefficients of thermal shrinkage in the TD direction and the MD direction, whichever is greater, is preferably in the above range. When at least either of the coefficients of thermal shrinkage in the TD direction and the MD direction, whichever is greater is in the above range, the second transparent plastic film substrate 2 is deformed by shrinkage due to heating during lamination and conforms to an irregular surface of the printed substrate to thereby reduce occurrence of wrinkles due to the irregular surface. As an example of the second transparent plastic film substrate, a polyolefin resin film such as a polypropylene film is particularly preferred. The polypropylene film can be used as the second transparent plastic film substrate to conform to an irregular surface of the printed substrate and reduce occurrence of wrinkles due to the irregular surface when the film is bonded to the printed substrate.

Further, in the present embodiment, the second transparent plastic film substrate 2 preferably contains an ultraviolet absorber or fluorescent brightening agent. The ultraviolet absorber or fluorescent brightening agent can be added to the second transparent plastic film substrate 2 to impart a function of reducing ultraviolet transmission. A method for adding an ultraviolet absorber or fluorescent brightening agent to the second transparent plastic film substrate 2 may be, for example, impregnation.

The thickness of the second transparent plastic film substrate 2 is not specifically limited, but is preferably not more than 100 μm in order to reduce the total thickness of the transparent gas barrier laminate film 100. Further, the thickness of the second transparent plastic film substrate 2 may be, for example, not less than 12 μm, not less than 25 μm, or not less than 30 μm in view of ease of reduction of occurrence of wrinkles due to irregular surface of the printed substrate.

As shown in FIG. 1, the first adhesive layer 7a is provided to bond the second transparent plastic film substrate 2 and the gas barrier layer 6 formed on the first transparent plastic film substrate 1 to each other. The first adhesive layer 7a may be, but is not specifically limited to, an adhesive or pressure-sensitive adhesive such as an acrylic material, urethane-based material and polyester-based material. More specifically, any of acrylic pressure-sensitive adhesive, acrylic adhesive, urethane-based adhesive and ester-based adhesive may be used. In particular, the pressure-sensitive adhesive has good conformity to an irregular surface of the printed substrate in laminating the transparent gas barrier laminate film on the printed substrate for electronic paper. Further, acrylic pressure-sensitive adhesive is advantageous due to high transparency.

Further, the first adhesive layer 7a preferably includes an ultraviolet absorber or fluorescent brightening agent. In the electronic paper element as well, a transparent gas barrier laminate film preferably has a function of reducing ultraviolet transmission to protect internal components such as liquid crystals. The ultraviolet absorber or fluorescent brightening agent can be added to the first adhesive layer 7a to impart a function of reducing ultraviolet transmission.

The thickness of the first adhesive layer 7a is not specifically limited, but is preferably not more than 30 μm in order to reduce the total thickness of the transparent gas barrier laminate film 100. Meanwhile, the thickness of the first adhesive layer 7a is preferably not less than 3 μm in order to obtain good adhesiveness.

When a pressure-sensitive adhesive layer is formed as the first adhesive layer 7a, a pressure-sensitive adhesive is applied on either of the surfaces to be bonded and is dried as necessary to thereby form a pressure-sensitive adhesive layer.

A coating device of a pressure-sensitive adhesive may be a reverse roll coater, knife coater, bar coater, slot die coater, air knife coater, reverse gravure coater, vario gravure coater or the like. The coating amount of the pressure-sensitive adhesive is preferably in the range of 1 to 30 μm in thickness.

In the present embodiment, the seal layer 8 is formed on the other surface of the first transparent plastic film substrate. Examples of a material of the seal layer 8 include polyethylene, polypropylene, ethylene-vinyl acetate copolymer, ethylene-methacrylic acid copolymer, ethylene-methacrylic acid ester copolymer, ethylene-acrylic acid copolymer, ethylene-acrylic acid ester copolymer, and a resin of metal cross-linked products thereof. In view of processability and flexibility, ethylene-vinyl acetate copolymer resin is preferably used. The seal layer 8 containing ethylene-vinyl acetate copolymer resin can reduce deformation of the transparent gas barrier laminate film in sealing of the electronic paper and reduce damage to the barrier layer.

When an ethylene-vinyl acetate copolymer resin is used for the seal layer, a vinyl acetate content is preferably in the range of 10 to 30 mol %, in particular. That is, a content of the constituent unit derived from vinyl acetate in the total constituent units in an ethylene-vinyl acetate copolymer resin is preferably in the range of 10 to 30 mol %. When the vinyl acetate content is 10 mol % or more, good low-temperature sealability is achieved, which facilitates sealing of electronic paper. Further, when the vinyl acetate content is 30 mol % or less, good processability of the seal layer is favorably achieved during bonding from an ethylene-vinyl acetate copolymer resin film by using a roll.

According to the transparent gas barrier laminate film of the present embodiment, the seal layer can be bonded to an irregular surface of a printed substrate without creating wrinkles by heat-sealing the seal layer to the printed substrate. As a result, an electronic paper element having good sealing strength can be obtained. In other words, the transparent gas barrier laminate film is disposed on a printed substrate having an irregular surface such that the seal layer faces the irregular surface, and the printed substrate and the transparent gas barrier adhesive film are heated and pressured (heat-sealed). As a result, an electronic paper element sealed by the transparent gas barrier laminate film is obtained. According to the electronic paper element, occurrence of wrinkles is reduced and good seal strength can be obtained.

Although the thickness of the seal layer 8 is determined depending on the application, it is typically within the range of 15 to 200 μm.

Further, in forming the seal layer 8 on the first transparent plastic film substrate 1, an anchor coat layer (not shown) may be used to further improve adhesiveness. That is, the anchor coat layer is provided between the first transparent plastic film substrate 1 and the seal layer 8. The anchor coat layer may be made of, but not specifically limited to, an adhesive or pressure-sensitive adhesive such as an acrylic material, urethane-based material and polyester-based material.

The seal layer 8 is preferably formed by an extrusion lamination method or the like, but may be formed by other methods known in the art.

<Transparent Gas Barrier Laminate Film According to Second Embodiment>

Figure 2:
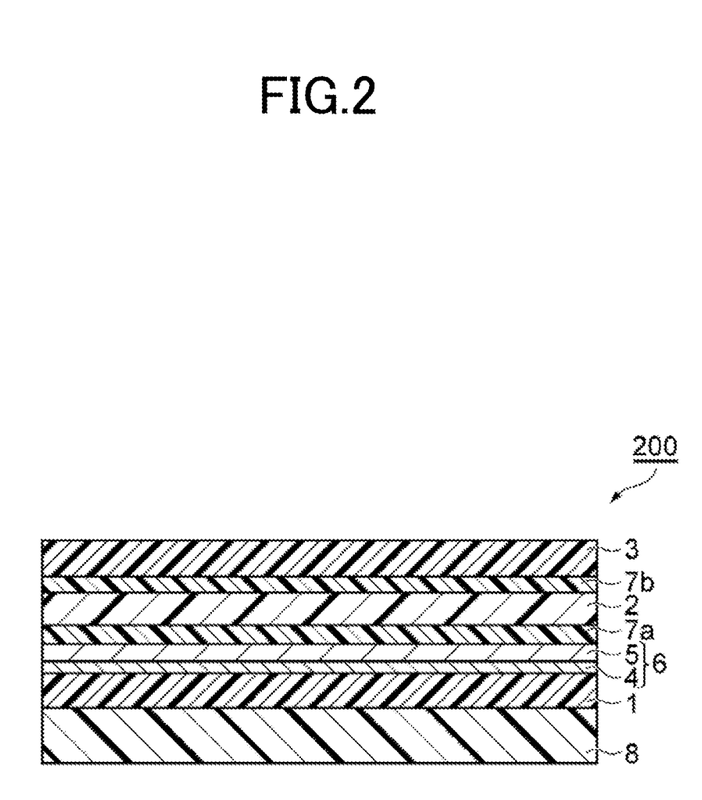
FIG. 2 is a schematic cross-sectional view of a transparent gas barrier laminate film according to a second embodiment of the present invention.

A second embodiment of the present invention will be described. FIG. 2 is a schematic cross-sectional view of a transparent gas barrier laminate film 200 according to the second embodiment of the present invention. The transparent gas barrier laminate film 200 of the second embodiment includes a third transparent plastic film substrate 3 and a second adhesive layer 7b in addition to the transparent gas barrier laminate film 100 of the first embodiment. Accordingly, elements in the transparent gas barrier laminate film 200 of the second embodiment which are the same as those of the first embodiment are referred by the same reference characters and the description thereof will be omitted.

As shown in FIG. 2, the transparent gas barrier laminate film 200 of the present embodiment has a structure in which the third transparent plastic film substrate 3 is disposed on the second transparent plastic film substrate 2 via the second adhesive layer 7b.

The third transparent plastic film substrate 3 may be formed of the same material as the first transparent plastic film substrate 1. A polyester film such as polyethylene terephthalate film and polyethylene naphthalate film, when used as the third transparent plastic film substrate 3, can further facilitate bonding to a printed substrate without creating wrinkles since it has heat resistance. In particular, the third transparent plastic film substrate preferably has a coefficient of thermal shrinkage of 5% or less at 150° C. for 30 minutes.

Further, the second adhesive layer 7b may be made of the same material as that of the first adhesive layer 7a, and an ultraviolet absorber or fluorescent brightening agent can be added to the third transparent plastic film substrate 3 to impart a function of reducing ultraviolet transmission.

<Transparent Gas Barrier Laminate Film According to Third Embodiment>

Figure 3:
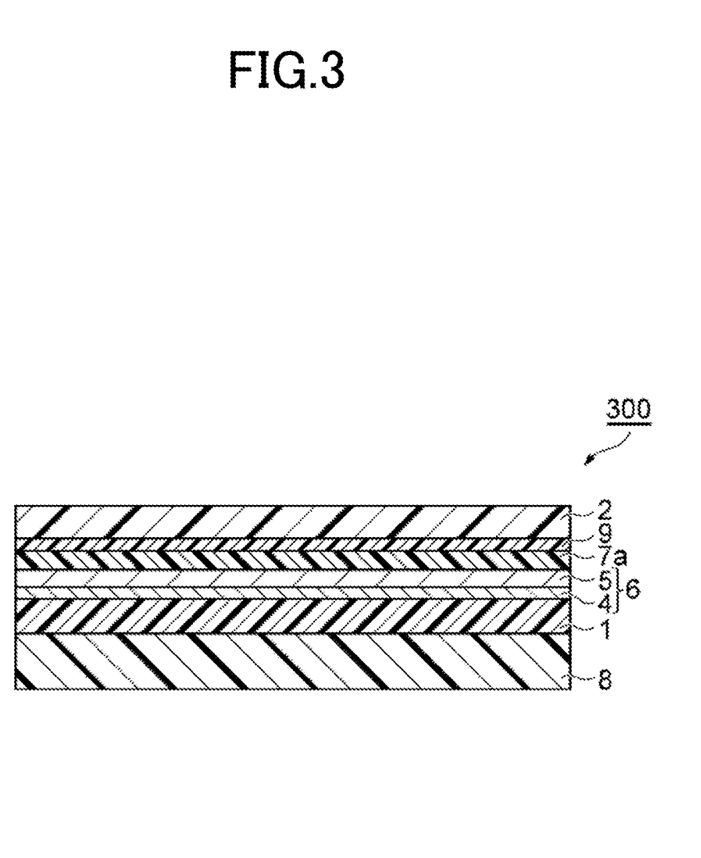
FIG. 3 is a schematic cross-sectional view of a transparent gas barrier laminate film according to a third embodiment of the present invention.

With reference to the drawings, a third embodiment of the present invention will be described. FIG. 3 is a schematic cross-sectional view of a transparent gas barrier laminate film according to a third embodiment of the present invention. In the transparent gas barrier laminate film 300 of the third embodiment, the first adhesive layer 7a in the transparent gas barrier laminate film 100 of the first embodiment does not include an ultraviolet absorber or fluorescent brightening agent. Instead, a coat layer 9 that includes at least one selected from ultraviolet absorbers and fluorescent brightening agents is disposed on the underside of the second transparent plastic film substrate 2 (on the surface facing the gas barrier layer).

The coat layer 9 is provided to favorably maintain the display performance of the electronic paper over a long period of time since it has a function of reducing ultraviolet transmission. In view of obtaining an excellent function of reducing ultraviolet transmission and achieving high transparency, the coat layer 9 preferably contains as a component at least one selected from the group consisting of benzophenone, benzotriazole, hydroxyphenyl triazine, benzoxazolyl thiophene and distyrylbiphenyl derivative, which are ultraviolet absorbers or fluorescent brightening agents.

The coat layer 9 is provided between the second transparent plastic film substrate 2 and the first adhesive layer 7a by applying and drying a coating agent containing an ultraviolet absorber or fluorescent brightening agent on one surface of the second transparent plastic film substrate 2, and bonding the dried coated surface to the gas barrier layer 6 formed on the first transparent plastic film substrate 1 via the first adhesive layer 7a which serves as an adhesive or pressure-sensitive adhesive. The coating agent containing an ultraviolet absorber or fluorescent brightening agent may be applied by a method known in the art such as dipping, roll coating, screen printing, spray coating, gravure printing or the like. Although the thickness of the coat layer varies depending on the type of coating agent, processing machine or processing condition, it is preferably in the range of 0.01 to 50 μm, and more preferably in the range of 1 to 30 μm.

<Transparent Gas Barrier Laminate Film According to Fourth Embodiment>

Figure 4:
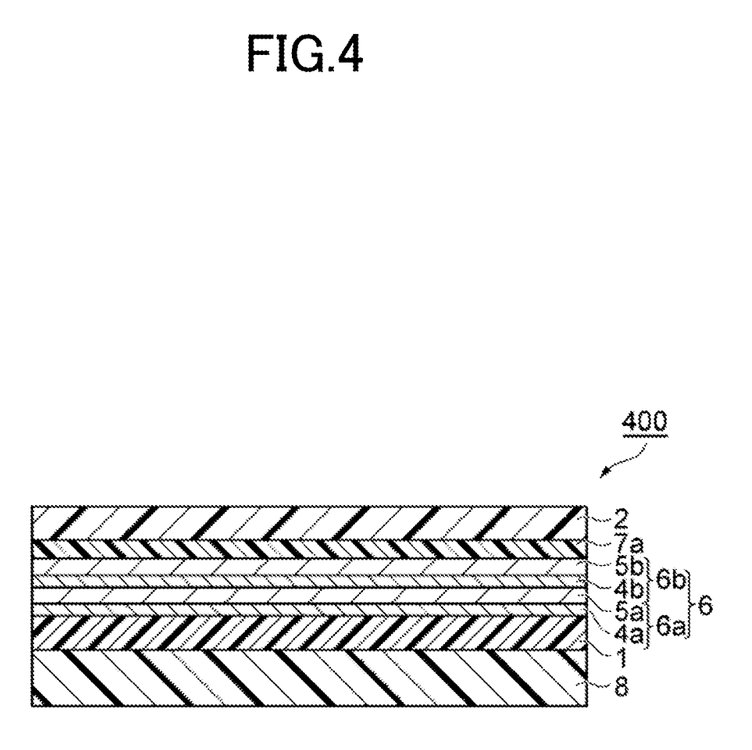
FIG. 4 is a schematic cross-sectional view of a transparent gas barrier laminate film according to a fourth embodiment of the present invention.

With reference to the drawings, a fourth embodiment of the present invention will be described. FIG. 4 is a schematic cross-sectional view of a transparent gas barrier laminate film 400 according to a fourth embodiment of the present invention. In the transparent gas barrier laminate film 400 of the fourth embodiment, the gas barrier layer 6 of the transparent gas barrier laminate film 100 in the first embodiment has a two-layer configuration in which the inorganic thin film layer 4 and the gas barrier cover layer 5 are alternately laminated. In other words, the gas barrier layer 6 of the transparent gas barrier laminate film 400 has a two layer (first gas barrier layer 6a and second gas barrier layer 6b) configuration in which the first gas barrier layer 6a composed of the first inorganic thin film layer 4a and the first gas barrier cover layer 5a and the second gas barrier layer 6b composed of the second inorganic thin film layer 4b and the second gas barrier cover layer 5b are formed in this order, and the gas barrier layer 6 is formed on the first transparent plastic film substrate 1. Accordingly, gas barrier properties of the transparent gas barrier laminate film can be further improved. Note that, in the present embodiment, the gas barrier layer 6 is not limited to the two-layer configuration, but may have a multi-layered configuration of three or more layers.

While the preferred embodiments of the present invention are described above, the technical scope of the present invention is not limited to the above embodiments, and various modifications can be made without departing from the principle of the present invention.

For example, although the gas barrier layer 6 of the above embodiment is formed only on one surface of the first transparent plastic film substrate 1, it may be formed on both surfaces (one and the other surfaces) of the first transparent plastic film substrate 1. In this case, for example, the inorganic thin film layer 4 is additionally formed on the other surface of the first transparent plastic film substrate 1, and the gas barrier cover layer 5 is laminated on the inorganic thin film layer 4.

Further, although the seal layer 8 of the present embodiment is formed on the other surface of the first transparent plastic film substrate 1 (the surface opposite to the second transparent plastic film substrate 2), it may be formed on the other surface of the second transparent plastic film substrate 2 (the surface opposite to the first transparent plastic film substrate 1). For example, when the gas barrier layer 6 is formed on each surface of the first transparent plastic film substrate 1, the seal layer 8 may be formed on the other surface of the second transparent plastic film substrate 2, or may be formed on the other surface of the first transparent plastic film substrate 1 via the gas barrier layer. Accordingly, in one embodiment of the transparent gas barrier laminate film of the present invention, the gas barrier layer 6 may be sandwiched between the first transparent plastic film substrate 1 and the seal layer 8.

Moreover, when the seal layer 8 is formed on the other surface of the second transparent plastic film substrate 2, the third transparent plastic film substrate 3 is disposed (formed) on the other surface of the first transparent plastic film substrate 1 via the second adhesive layer 7b.

EXAMPLES

The present invention will be further described in detail by means of the Examples (Configurations 1 to 11) and Comparative Examples (Comparative Configuration 1). However, as discussed, the present invention is not limited to these Examples.

Examples

[Configuration 1]
(Formation of Gas Barrier Layer)

Silicon oxide was provided as an inorganic thin film layer of thickness 250 Å on one surface of a polyethylene terephthalate film with thickness 12 μm, which was provided as a first transparent plastic film substrate, by vacuum vapor deposition. Further, coating liquid which contained tetraethoxysilane and polyvinyl alcohol was applied on the inorganic thin film layer by wet coating to form a gas barrier cover layer with thickness 0.3 μm. Thus, a gas barrier layer composed of the inorganic thin film layer and the gas barrier cover layer was formed on one surface of the first transparent plastic film substrate.

(Manufacturing of Transparent Gas Barrier Laminate Film)

Subsequently, a pressure-sensitive adhesive made of an acrylic resin which contained an ultraviolet absorber at the weight ratio of 3% to the solid content of the acrylic resin was coated on one surface of a polypropylene film (OPP, thermal shrinkage in the TD direction (maximum shrinkage direction) at 150° C. for 30 minutes: 9.2%) of thickness 50 μm, which was provided as a second transparent plastic film substrate, by wet coating. The second transparent plastic film substrate was bonded to the gas barrier layer surface formed on the first transparent plastic film substrate with the coated pressure-sensitive adhesive interposed therebetween.

Then, an anchor coat layer made of a polyurethane resin was coated on the surface of the first transparent plastic film substrate opposite to the gas barrier layer by wet coating, and an ethylene-vinyl acetate copolymer resin was applied on the coated surface by extrusion lamination so that a seal layer made of an ethylene-vinyl acetate copolymer resin was formed on the other surface of the first transparent plastic film substrate via the anchor coat layer. Thus, a transparent gas barrier laminate film of Configuration 1 according to the first embodiment shown in FIG. 1 was manufactured.

(Manufacturing of Electronic Paper Element)

The seal layer of the thus obtained transparent gas barrier laminate film was attached to a printed substrate and bonded thereto by heat sealing to thereby manufacture an electronic paper element of Configuration 1.

[Configuration 2]

First, the gas barrier layer composed of the inorganic thin film layer and the gas barrier cover layer was formed on one surface of the first transparent plastic film substrate by the same procedure as that of Configuration 1.

Subsequently, a pressure-sensitive adhesive made of an acrylic resin which contained an ultraviolet absorber at the weight ratio of 3% to the solid content of the acrylic resin was coated as a second adhesive layer on one surface of a polypropylene film (OPP, thermal shrinkage in the TD direction (maximum shrinkage direction) at 150° C. for 30 minutes: 9.2%) of thickness 50 μm, which was provided as a second transparent plastic film substrate by wet coating. Then, the second transparent plastic film substrate was bonded to a polyethylene terephthalate film (PET) of thickness 12 μm, which was provided as a third transparent plastic film substrate, with the coated pressure-sensitive adhesive interposed therebetween.

Subsequently, a pressure-sensitive adhesive made of an acrylic resin which did not contain an ultraviolet absorber was coated as a first adhesive layer on the other surface of the second transparent plastic film substrate, which was bonded to the third transparent plastic film substrate as described above, and the second transparent plastic film substrate was bonded to the gas barrier layer formed on the first transparent plastic film substrate with the coated pressure-sensitive adhesive interposed therebetween.

Then, an anchor coat layer and a seal layer were formed on the surface of the first transparent plastic film substrate opposite to the gas barrier layer by the same procedure as that of Configuration 1 to thereby manufacture a transparent gas barrier laminate film of Configuration 2 according to the second embodiment shown in FIG. 2. Further, an electronic paper element of Configuration 2 was obtained by the same procedure as that of Configuration 1 except for using the above transparent gas barrier laminate film.

[Configuration 3]

Silicon oxide was provided as an inorganic thin film layer of thickness 250 Å on one surface of a polyethylene terephthalate film with thickness 12 μm, which was provided as a first transparent plastic film substrate, by vacuum vapor deposition. Then, coating liquid which contained tetraethoxysilane and polyvinyl alcohol was applied on the inorganic thin film layer by wet coating to form a gas barrier cover layer with thickness 0.3 μm. Further, silicon oxide was provided as an inorganic thin film layer of thickness 250 Å on the gas barrier cover layer. Then, coating liquid which contained tetraethoxysilane and polyvinyl alcohol was applied on the inorganic thin film layer by wet coating to form a gas barrier cover layer with thickness 0.3 μm. Thus, the transparent gas barrier laminate film of Configuration 3 according to the fourth embodiment shown in FIG. 4 was obtained by the same procedure as that of Configuration 1 except that the gas barrier layer has a configuration in which two alternating layers of the inorganic thin film layer and the gas barrier cover layer were laminated. Further, an electronic paper element of Configuration 3 was obtained by the same procedure as that of Configuration 1 except for using the above transparent gas barrier laminate film.

[Configuration 4]

An electronic paper element of Configuration 4 was obtained by the same procedure as that of Configuration 1 except for using a polyethylene terephthalate film (PET, thermal shrinkage in the TD direction (maximum shrinkage direction) at 150° C. for 30 minutes: 1.0% or less) of thickness 25 μm instead of the polypropylene film of 50 μm as the second transparent plastic film substrate. Further, an electronic paper element of Configuration 4 was obtained by the same procedure as that of Configuration 1 except for using the above transparent gas barrier laminate film.

[Configuration 5]

A transparent gas barrier laminate film of Configuration 5 was obtained by the same procedure as that of Configuration 1 except for using the pressure-sensitive adhesive made of an acrylic resin which did not contain an ultraviolet absorber. Further, an electronic paper element of Configuration 5 was obtained by the same procedure as that of Configuration 1 except for using the above transparent gas barrier laminate film.

Comparative Examples

Comparative Configuration 1

A transparent gas barrier laminate film of Comparative Configuration 1 was obtained by the same procedure as that of Configuration 1 except for using a polyvinylidene chloride (PVDC) coat polyethylene terephthalate film of thickness 12 μm instead of the gas barrier layer composed of the inorganic thin film layer and the gas barrier cover layer. Further, an electronic paper element of Comparative Configuration 1, which was Comparative Example, was obtained by the same procedure as that of Configuration 1 except for using the above transparent gas barrier laminate film.

Evaluation was performed as below for the transparent gas barrier laminate film and the electronic paper element manufactured in Configurations 1 to 5 of Examples and Comparative Configuration 1 of Comparative Example.

<Measurement of Water Vapor Transmission Rate>

For the transparent gas barrier laminate film manufactured in Configurations 1 to 5 of Examples and Comparative Configuration 1 of Comparative Example, the water vapor transmission rate was measured under the condition of 40° C., 90% RH by using a water vapor transmission rate measurement apparatus (PERMATRAN 3/31, manufactured by Modern Control, Inc.).

<Measurement of Optical Transmittance>

For the transparent gas barrier laminate film manufactured in Configurations 1 to 5 of Examples and Comparative Configuration 1 of Comparative Example, the optical transmittance at the wavelength of 400 nm was measured by using a spectrophotometer (UV-3100, manufactured by Shimadzu Corporation).

<Appearance Evaluation>

For the electronic paper element manufactured in Configurations 1 to 5 of Examples and Comparative Configuration 1 of Comparative Example, the appearance of the transparent gas barrier laminate film bonded to the printed substrate was visually observed. Good appearance without wrinkles was determined as "A", appearance with unnoticeable wrinkles partially formed was determined as "B", and poor appearance with a large number of wrinkles was determined as "C".

the gas barrier cover layer, and the electronic paper element had low durability (water vapor resistance).

[Configuration 6]
(Formation of Gas Barrier Layer)

TABLE 1

|  |  |  |  | Manufacturing conditions | | First adhesive layer Presence | Second adhesive layer Presence | Evaluation | | |
| --- | --- | --- | --- | --- | --- | --- | --- | --- | --- | --- |
|  |  |  |  | Gas barrier layer | | (○) or | (○) or | | Optical | |
|  |  | Second substrate | Third substrate | Inorganic thin film layer | Gas barrier cover layer | absence (x) of ultraviolet absorber | absence (x) of ultraviolet absorber | Water vapor transmission rate (g/m² · day) | transmittance (%) (wavelength 400 nm) | Appearance (wrinkles) |
| Example | Configuration 1 | OPP | — | one layer | one layer | ○ | — | 0.02 | 18 | A |
|  | Configuration 2 | OPP | PET | one layer | one layer | x | ○ | 0.01 | 19 | A |
|  | Configuration 3 | OPP | — | two layers | two layers | ○ | — | 0.005 | 18 | A |
|  | Configuration 4 | PET | — | one layer | one layer | ○ | — | 0.03 | 19 | B |
|  | Configuration 5 | OPP | — | one layer | one layer | x | — | 0.02 | 80 | A |
| Comparative Example | Comparative Configuration 1 | OPP | — | — | — | ○ | — | 1.5 | 18 | A |

Table 1 shows the manufacturing conditions and evaluation results of Configurations 1 to 5 of Examples and Comparative Configuration 1 of Comparative Example.

As seen from the results in Table 1, the transparent gas barrier laminate film of Configurations 1 to 5 exhibited good barrier properties by virtue of having the inorganic thin film layer, the gas barrier cover layer and the seal layer. Further, in Configurations 1 to 4, a function of reducing ultraviolet transmission was observed since an ultraviolet absorber was added to the pressure-sensitive adhesive of the first adhesive layer or the second adhesive layer. Further, in Configurations 1 to 3, the electronic paper element was bonded to a printed substrate without creating wrinkles even if the printed substrate has an irregular surface since a polypropylene film was used for the second transparent plastic film substrate or the third transparent plastic film substrate. Accordingly, an electronic paper element with good appearance was manufactured.

Further, the result shows that fewer wrinkles were observed in the appearance of the transparent gas barrier laminate film of Configurations 1 to 3 and 5 which used a polypropylene film as the second plastic film substrate than that of the transparent gas barrier laminate film of Configuration 4 which used a polyethylene terephthalate as the second plastic film substrate. However, since the wrinkles observed in Configuration 4 were not so prominent, the appearance was determined as acceptable.

The transparent gas barrier laminate film of Configuration 5 had a high ultraviolet transmittance since it did not contain an ultraviolet absorber. Accordingly, there is a risk that a stable display performance of the electronic paper element cannot be expected.

The transparent gas barrier laminate film of Comparative Configuration 1, which was a Comparative Example, had poor barrier performance since it did not include a gas barrier layer composed of the inorganic thin film layer and First, the gas barrier layer composed of the inorganic thin film layer and the gas barrier cover layer was formed on one surface of the first transparent plastic film substrate by the same procedure as that of Configuration 1.

(Manufacturing of Transparent Gas Barrier Laminate Film)

Subsequently, a pressure-sensitive adhesive made of an acrylic resin which contains an ultraviolet absorber at the weight ratio of 3% to the solid content of the acrylic resin was coated on one surface of a polyethylene terephthalate film of thickness 12 μm, which was provided as a second transparent plastic film substrate by wet coating. Then, the second transparent plastic film substrate was bonded to the gas barrier layer formed on the first transparent plastic film substrate with the coated pressure-sensitive adhesive interposed therebetween.

Then, an anchor coat layer made of a polyurethane resin was applied on the surface of the first transparent plastic film substrate opposite to the gas barrier layer by wet coating, and an ethylene-vinyl acetate copolymer resin with a vinyl acetate content of 20 mol % was applied on the coated surface by extrusion lamination so that a seal layer made of an ethylene-vinyl acetate copolymer resin was formed on the other surface of the first transparent plastic film substrate via the anchor coat layer. Thus, the transparent gas barrier laminate film of Configuration 6 according to the first embodiment shown in FIG. 1 was manufactured.

(Manufacturing of Electronic Paper Element)

An electronic paper element of Configuration 6 was manufactured by the same procedure as that of Configuration 1 except for using the above transparent gas barrier laminate film.

[Configuration 7]

A transparent gas barrier laminate film of Configuration 7 according to the third embodiment shown in FIG. 3 was obtained by the same procedure as that of Configuration 6 except for providing a coat layer by applying a coating agent made of a polyester resin which contained an ultraviolet absorber at the weight ratio of 5% to the solid content of the polyester resin on one surface of a polyethylene terephthalate film of thickness 12 μm, which was provided as a second transparent plastic film substrate by wet coating, and providing a pressure-sensitive adhesive made of an acrylic resin which did not contain an ultraviolet absorber on the coat layer. Further, an electronic paper element of Configuration 7 was obtained by the same procedure as that of Configuration 6 except for using the above transparent gas barrier laminate film.

[Configuration 8]

A transparent gas barrier laminate film of Configuration 8 according to the first embodiment shown in FIG. 1 was obtained by the same procedure as that of Configuration 6 except for using a polyethylene terephthalate film with thickness 12 μm with an ultraviolet absorber impregnated by a dyeing method as a second transparent plastic film substrate, and using a pressure-sensitive adhesive made of an acrylic resin which did not contain an ultraviolet absorber. Further, an electronic paper element of Configuration 8 was obtained by the same procedure as that of Configuration 6 except for using the above transparent gas barrier laminate film.

[Configuration 9]

Silicon oxide was provided as an inorganic thin film layer of thickness 250 Å on one surface of a polyethylene terephthalate film with thickness 12 μm, which was provided as a first transparent plastic film substrate, by vacuum vapor deposition. Then, coating liquid which contained tetraethoxysilane and polyvinyl alcohol was applied on the inorganic thin film layer by wet coating to form a gas barrier cover layer with thickness 0.3 μm. Then, coating liquid which contained tetraethoxysilane and polyvinyl alcohol was applied on the inorganic thin film layer by wet coating to form a gas barrier cover layer with thickness 0.3 μm. A transparent gas barrier laminate film of Configuration 9 according to the fourth embodiment shown in FIG. 4 was obtained by the same procedure as that of Configuration 6 except that the gas barrier layer has a configuration in which two alternating layers of the inorganic thin film layer and the gas barrier cover layer were laminated. Further, an electronic paper element of Configuration 9 was obtained by the same procedure as that of Configuration 6 except for using the above transparent gas barrier laminate film.

[Configuration 10]

A transparent gas barrier laminate film of Configuration 10 was obtained by the same procedure as that of Configuration 6 except for using the pressure-sensitive adhesive made of an acrylic resin which did not contain an ultraviolet absorber. Further, an electronic paper element of Configuration 10 was obtained by the same procedure as that of Configuration 6 except for using the above transparent gas barrier laminate film.

[Configuration 11]

A transparent gas barrier laminate film of Configuration 11 was obtained by the same procedure as that of Configuration 6 except for using an ethylene-vinyl acetate copolymer resin with a vinyl acetate content of 7% as a seal layer. Further, an electronic paper element of Configuration 11 was obtained by the same procedure as that of Configuration 6 except for using the above transparent gas barrier laminate film.

Evaluation was performed as below for the transparent gas barrier laminate film and the electronic paper element manufactured in Configurations 6 to 11.

For the transparent gas barrier laminate film and the electronic paper element manufactured in Configurations 6 to 11, measurement was performed in the same conditions as those of the transparent gas barrier laminate film and the electronic paper element manufactured in Configurations 1 to 5 and Comparative Configuration 1 except for the measurement described below.

<Measurement of Optical Transmittance>

For the transparent gas barrier laminate film manufactured in Configurations 6 to 11, the optical transmittance at the wavelengths of 380 nm and 420 nm was measured by using a spectrophotometer (UV-3100, manufactured by Shimadzu Corporation).

<Evaluation of Seal Strength>

For the electronic paper element manufactured in Configurations 6 to 11, peeling strength was measured as the evaluation of seal strength between the transparent gas barrier laminate film and the printed substrate by using a peeling test machine (AGS-X, manufactured by Shimadzu Corporation) with a test piece width of 15 mm, a peeling angle of 180 degrees and a peeling speed of 300 mm/min.

TABLE 2

| | | Manufacturing conditions | | | | | | Evaluation | | | |
| | | Gas barrier layer | | First adhesive layer Presence (o) or absence (x) of ultraviolet absorber | Second adhesive layer Presence (o) or absence (x) of ultraviolet absorber | Coat layer Presence (o) or absence (x) of ultraviolet absorber | Seal layer vinyl acetate content | Water vapor transmission rate (g/m$^2$·day) | Optical transmittance (%) | | Peeling strength (N) | Appearance (wrinkles) |
| | | Inorganic thin film layer | Gas barrier cover layer | | | | | | wavelength 380 nm | wavelength 420 nm | | |
| Example | Configuration 6 | one layer | one layer | o | x | — | 20% | 0.05 | 2 | 75 | 10 | B |
| | Configuration 7 | one layer | one layer | x | x | o | 20% | 0.04 | 6 | 78 | 13 | B |
| | Configuration 8 | one layer | one layer | x | o | — | 20% | 0.05 | 3 | 77 | 12 | B |
| | Configuration 9 | two layers | two layers | o | x | — | 20% | 0.03 | 2 | 76 | 11 | B |
| | Configuration | one layer | one layer | x | x | — | 20% | 0.04 | 87 | 88 | 12 | B |

TABLE 2-continued

| | Manufacturing conditions | | | | | | | Evaluation | | | |
|---|---|---|---|---|---|---|---|---|---|---|---|
| | Gas barrier layer | | First adhesive layer Presence (o) or absence (x) of ultraviolet absorber | Second adhesive layer Presence (o) or absence (x) of ultraviolet absorber | Coat layer Presence (o) or absence (x) of ultraviolet absorber | Seal layer vinyl acetate content | Water vapor transmission rate (g/m² · day) | Optical transmittance (%) | | Peeling strength (N) | Appearance (wrinkles) |
| | Inorganic thin film layer | Gas barrier cover layer | | | | | | wavelength 380 nm | wavelength 420 nm | | |
| Configuration 11 | 10 | one layer | one layer | o | x | — | 7% | 0.07 | 3 | 76 | 3 | B |

Table 2 shows the manufacturing conditions and evaluation results of Configurations 6 to 11.

As seen from the results in Table 2, the transparent gas barrier laminate film of Configurations 6 to 11 exhibited good barrier properties by virtue of having the inorganic thin film layer, the gas barrier cover layer and the seal layer. The transparent gas barrier laminate film of Configurations 6 to 9 and 11 had a function of reducing ultraviolet transmission since an ultraviolet absorber was added to the first adhesive layer, the coat layer or the second transparent plastic film substrate. Further, in Configurations 6 to 10, the seal layer was formed by extrusion lamination of an ethylene-vinyl acetate copolymer resin with a vinyl acetate content of 20%, and the obtained transparent gas barrier laminate film was used to manufacture the electronic paper element by heat-sealing to the printed substrate. Accordingly, bonding to the printed substrate with a sufficient seal strength (adhesiveness) was achieved.

On the other hand, the transparent gas barrier laminate film of Configuration 10 had a high ultraviolet transmittance since it did not contain an ultraviolet absorber. Accordingly, there is a risk that stable display performance of the electronic paper element might not be obtained.

The transparent gas barrier laminate film of Configuration 11 had poor seal strength (adhesiveness) between the transparent gas barrier laminate film and the printed substrate compared with that of Configuration 6 to 10 since the vinyl acetate content in the ethylene-vinyl acetate copolymer resin used as the seal layer was low. Further, since the wrinkles observed in Configurations 6 to 11 were not so prominent, the appearance was determined as acceptable.

INDUSTRIAL APPLICABILITY

The transparent gas barrier laminate film of the present invention can be applied to displays for electronic paper elements, organic EL elements and the like having a substrate made of a plastic film that requires high gas barrier properties or ultraviolet resistance, soft packaging materials, and industrial material applications such as solar cells.

REFERENCE SIGNS LIST

1 . . . First transparent plastic film substrate; 2 . . . Second transparent plastic film substrate; 3 . . . Third transparent plastic film substrate; 4 . . . Inorganic thin film layer; 5 . . . Gas barrier cover layer; 6 . . . Gas barrier layer; 7a . . . First adhesive layer; 7b . . . Second adhesive layer; 8 . . . Seal layer; 9 . . . Coat layer; 100, 200, 300, 400 . . . Transparent gas barrier laminate film

What is claimed is:

1. A transparent gas barrier laminate film, comprising:
a gas barrier layer including an inorganic thin film layer formed on at least one surface of a first transparent plastic film substrate, and the surface of the first transparent plastic film substrate on which the gas barrier layer is formed and one surface of a second transparent plastic film substrate are bonded to each other with a first adhesive layer interposed therebetween, and
a seal layer is formed on the other surface of the first transparent plastic film substrate or the second transparent plastic film substrate, wherein the second transparent plastic film substrate is a polypropylene film having a coefficient of thermal shrinkage of the second transparent plastic film substrate at 150° C. for 30 minutes in a range of more than 5% and 15% or less, wherein the first transparent film comprises polyethylene terephthalate or polyethylene naphthalate and a thickness of the second transparent plastic film is from 30 μm to 100 μm.

2. The transparent gas barrier laminate film of claim 1, wherein the gas barrier layer includes the inorganic thin film layer and a gas barrier cover layer formed on the inorganic thin film layer.

3. The transparent gas barrier laminate film of claim 1, wherein a third transparent plastic film substrate is disposed via a second adhesive layer on a surface opposite to a surface on which the seal layer is formed.

4. The transparent gas barrier laminate film of claim 3, wherein the third transparent plastic film substrate is a polyester film.

5. The transparent gas barrier laminate film of claim 3, wherein the second adhesive layer includes at least one selected from ultraviolet absorbers and fluorescent brightening agents.

6. The transparent gas barrier laminate film of claim 3, wherein at least one selected from ultraviolet absorbers and fluorescent brightening agents is impregnated in the third transparent plastic film substrate.

7. The transparent gas barrier laminate film of claim 1, wherein the first adhesive layer includes at least one selected from ultraviolet absorbers and fluorescent brightening agents.

8. The transparent gas barrier laminate film of claim 1, wherein a coat layer including at least one selected from ultraviolet absorbers and fluorescent brightening agents is provided between the second transparent plastic film substrate and the first adhesive layer.

9. The transparent gas barrier laminate film of claim 1, wherein at least one selected from ultraviolet absorbers and fluorescent brightening agents is impregnated in the second transparent plastic film substrate.

10. The transparent gas barrier laminate film of claim 1, wherein the seal layer contains an ethylene-vinyl acetate copolymer resin.

11. The transparent gas barrier laminate film of claim 10, wherein a vinyl acetate content in the ethylene-vinyl acetate copolymer resin is in a range of 10 to 30 mol %.

12. The transparent gas barrier laminate film of claim 1, wherein the gas barrier layer comprises two or more inorganic thin film layers and two or more gas barrier cover layers that are alternatively laminated.

13. Electronic paper that is sealed by the transparent gas barrier laminate film of claim 1 via the seal layer.

14. The transparent gas barrier laminate film of claim 1, wherein the thickness of the second transparent plastic film is from 50 μm to 100 μm.

\* \* \* \* \*